United States Patent [19]

Nakagawa et al.

[11] Patent Number: 4,962,343

[45] Date of Patent: Oct. 9, 1990

[54] SIGNAL TRANSMISSION CIRCUIT

[75] Inventors: Shin-ichi Nakagawa; Hiroyuki Kawai, both of Itami, Japan

[73] Assignee: Mitsubishi Denki Kabushiki Kaisha, Tokyo, Japan

[21] Appl. No.: 303,797

[22] Filed: Jan. 27, 1989

[30] Foreign Application Priority Data

Sep. 9, 1988 [JP] Japan ................ 63-226942

[51] Int. Cl.$^5$ .............. H03K 17/56; H03K 17/16
[52] U.S. Cl. ............... 307/246; 307/443; 307/451; 307/480; 307/481
[58] Field of Search ............. 365/203, 204; 307/443, 307/448, 451, 480, 481, 246

[56] References Cited

U.S. PATENT DOCUMENTS 4,725,747 2/1988 Stein et al. ................ 307/481
4,745,305 5/1988 Crafts ..................... 307/443

OTHER PUBLICATIONS

Principles of CMOS VLSI Design, Weste, et al. pp. 163-172.

Primary Examiner—Stanley D. Miller
Assistant Examiner—Margaret Rose Wambach
Attorney, Agent, or Firm—Townsend and Townsend

[57] ABSTRACT

A signal transmission circuit constructed such that, when a signal of one channel is transmitted in two-divided signal transmission lines, discharge switching elements on two precharged signal transmission lines are controlled by four switching elements (three P-channel MOS transistors and one N-channel MOS transistor). Therefore, when one signal transmission line is at a low level during a signal transmission period, the discharge switching elements of both the signal transmitting lines conduct, leading one signal transmission line to be discharged. This causes the low level signal to be transmitted to the other signal transmitting line.

8 Claims, 9 Drawing Sheets

SIGNAL TRANSMISSION CIRCUIT

BACKGROUND OF THE INVENTION

1. Field of the Invention

This invention relates to a signal transmission circuit, and more particularly to a signal transmission circuit which is adapted to precharge a signal transmission line and transmit a signal due to whether the charge is maintained or discharged (connected to ground potential).

2. Description of the Prior Art

FIG. 1 is a typical circuit diagram of the conventional signal transmission circuit of a usual precharge system.

In FIG. 1, reference numeral 1 designates a signal transmissin line (bus), which is connected to power supply potential $V_{cc}$ through a P-channel MOS transistor 2 and to earth potential through a capacitor C.

The signal transmission line 1 connects with a data latch 3 for transmitting a signal and a register 4 for receiving the signal.

The data latch 3 is connected to a gate terminal of an N-channel MOS transistor 5 which connects at one end to earth potential and at the other end to one end of an N-channel MOS transistor 6, the other end of the transistor 6 being connected to the signal transmission line 1, the gate terminal of the same being connected to an output terminal of an AND gate 7.

The AND gate 7 has two inputs, one input of which is given an output clock for outputting the signal to the signal transmission line 1, the other input being given a selecting signal for outputting the signal from the data latch 3 with which the AND gate 7 is connected.

On the other hand, the resister 4 is connected to one end of an N-channel MOS transistor 8 connecting at the other end with the signal transmission line 1. The gate terminal of the N-channel MOS transistor 8 is connected to an input clock for fetching the signal from the signal transmission line 1.

Such conventional signal transmission circuit of precharge system operates as follows:

As shown in FIG. 2(a), precharge clock of negative logic which is given to the gate terminal of the P-channel MOS transistor 2 is at a low level during the precharge period and at a high level during the signal transmission period.

Also, as shown in FIG. 2(b), and an output clock which is at a low level during the precharge period and a high level during the signal transmission period is given to one input of the AND gate 7.

Furthermore, as shown in FIG. 2(c), an input clock which is given to the gate terminal of the N-channel MOS transistor 8 is at a low level during the entire precharge period and during most of the singal transmission period and at a high level only during rear part of the signal transmission period.

At first, during the precharge period, the precharge clock of negative logic is given as the low level signal to the gate terminal at the P-channel MOS transistor, whereby the signal transmission line 1 is connected with power supply potential $V_{cc}$. Hence, the capacitor C connected with the signal transmission line 1 is charged as shown in FIG. 2(d).

Next, during the signal transmission period, the output clock of high level signal and selecting signal are given to the AND gate 7, whereby the high level signal is given to the gate terminal of the N-channel MOS transistor 6 and the N-channel MOS transistor 6 conducts. At this time, it will be assumed that the output signal from the data latch 3 is a logical "1" (high level). Since the high level is given also to the gate terminal of the N-channel MOS transistor 5, the N-channel MOS transistor 5 conducts the signal transmission line 1 is grounded through the N-channel MOS transistors 6 and 5. When the signal-transmission line 1 is grounded, as shown by the broken line in FIG. 2(d), the capacitor C is discharged. Thereafter, as shown in FIG. 2(c), when the input clock of high level is given to the gate terminal of the N-channel MOS transistor 8, the low level signal, is inputted to the register 4 through the N-channel MOS transistor 8.

Meanwhile, when the low level signal is outputted from the data latch 3, the N-channel MOS transistor 5 does not conduct. The signal transmission line 1 is not grounded and the capacitor C is not discharged. Accordingly, since the signal transmission line 1 is kept at the high level even at signal transmission period, the high level signal is inputted into the register 4 at the timing of input clock shown in FIG. 2(c).

As is above-mentioned, in the conventional signal transmission circuit of precharge system shown in FIG. 1, the signal of logical "1" (at a high level) or "0" (at a low level) is inverted and inputted to the register 4.

In such conventional signal transmission circuit of precharge system, the longer a physical distance of signal transmission line 1 is, the more unstable the discharge of capacitor C is when the N-channel MOS transistor 5 and 6 conduct. This is shown by the one-dot broken line in FIG. 2(d), thereby creating the phenomenon of difficult discharge.

In light of the above circumstances, a signal trasmission circuit of, for example, the precharge system as shown in FIG. 3 is well-known.

The signal transmission circuit constructed as shown in FIG. 3 divides the signal transmission line (bus) into two line B1 and B2, to prevent the aforesaid precharge potential from being unstable.

In FIG. 3, first and second signal transmission lines (buses) B1 and B2 are connected at one ends to first and second signal input-output terminals 101 and 102 respectively through which the signal is inputted or output. At the other end, a connection is made to one input of a first NOR gate N1 and to one input of a second NOR gate N2 respectively. The signal is transmitted between both the signal input-output terminals 101 and 102 as discussed below.

The other inputs of both the NOR gates N1 and N2 connect with a first precharge signal terminal PC1.

The first signal transmission line B1 connectes with power supply potential $V_{cc}$ through a first MOS transistor (P-channel type) T51 as a switching element and with earth potential through a second MOS transistor (N-channel type) T52.

The second signal transmission line B2 connects with power supply potential $V_{cc}$ through a third MOS transistor (P-channel type) T53 at the switching element and with earth potential through a fourth MOS transistor (N-channel type) T54.

The gate terminal of the first and third MOS transistors (both P-channel) T51 and T53 are connected to a precharge signal terminal PC2. Accordingly, when the second precharge signal terminal PC2 is given the low level signal, both the P-channel MOS transistors T51 and T53 conduct so as to feed power supply potential to both signal transmission lines B1 and B2.

On the other hand, the output of the second NOR gate N2 is applied to the gate terminal of the second MOS transistor T52 of N-channel type. The output of the first NOR gate N1 is given to the gate terminal of the fourth MOS transistor T54 of N-channel type. Hence, when the output of the second NOR gate N2 is at a high level, in other words, the first precharge signal terminal PC1 and the second signal input-output terminal 102 are both low level inputs, the second MOS transistor T52 connects the first signal transmission line B1 to earth. Also, when the output of the first NOR gate N1 is at a high level the first precharge signal terminal PC1 and the first signal input-output terminal 101 are both at low level inputs, the fourth MOS transistor T54 connects the second signal transmissin line B2 to earth.

Such signal transmission circuit of precharge system operates as follows:

The first and second precharged signal terminals PC1 and PC2 are given the first and second precharge signals complementary with each other as shown in FIGS. 4(a) and (b). The period of keeping the first precharge signal at a high level is the precharge period, that of keeping the same at a low level being the signal transmission period.

Usually, in the signal transmission cicuit of a precharge system, a signal of logical "1" or "0" is transmitted as a function of whether or not the charge on the signal transmission line (precharge line) during the precharge period is discharged, as described in the explanation of operation in FIG. 1. The operation of the circuit shown in FIG. 3 is as follows:

The low level signal is inputted to the second precharge signal terminal PC2 during the precharge period. The first and third MOS transistors T51 and T53 conduct, and the high level signal is inputted to the first precharge signal terminal PC1. The outputs of both the NOR gates N1 and N2 are at low levels, and the second and fourth MOS transistors T52 and T54, whose gate terminals are given the outputs of NOR gate N1 and N2, do not conduct.

Accordingly, both the signal transmission lines B1 and B2 are connected to the power supply potential $V_{cc}$ during the precharge period. This allows them to be precharged from the power supply potential.

Next, since the second precharge signal terminal PC2 is turned to a high level during the signal transmission period, the first and third MOS transistors T51 and T53 do not conduct. Since the input signal to the first precharge terminal PC1 turns to low level, the outputs of both the NOR gates N1 and N2 change corresponding to the level of the input signal to the first signal input-output terminal 101 and second signal input-output terminal 102.

Now, assuming that, for example, the input signal to the first signal input-output terminal 101 (the signal to be transmitted from the first signal input-output terminal 101 to the second signal input-output terminal 102), is a logical "0", the input signal to the first signal input-output terminal 101 is a low level. Hence, the output of the first NOR gate N1 turns to a high level and is given to the gate terminal of the fourth MOS transistor T54. Accordingly, since the fourth MOS transistor T54 conducts, the second signal transmission line B2 is grounded through the fourth MOS transistor T54 and the signal output of the second signal input-output terminal 102 is at a low level.

On the contrary, when the signal to be transmitted is a logical "1", since the first signal input-output terminal 101 is given the high level signal, the output of the first NOR gate N1 is at a low level and the fourth MOS transistor T54, whose gate terminal is given the low level output, maintains the not-conductive state. Therefore, the signal output from the second signal output terminal 102 has a high level.

Namely, in the signal transmission cicuit shown in FIG. 3, the signal of logical "1" or "0" inputted from the first signal input-output terminal 101 (or the second signal input-output terminal 102) is inverted to be outputted to the second signal input-output terminal 102 (or the first signal input-output terminal 101).

Incidentally, in the aforesaid construction shown in FIG. 3 the two input NOR gates are used, but the usual two-input NOR gate adopts construction as shown in FIG. 5. The two references IN designate input terminals, the one reference OUT an output terminal, four MOS transistors TR1 through TR4.

The conventional signal tranmsmission circuit of a precharge system, which is constructed as above-mentioned, requires a total of 12 MOS transistors to be used as the switching element, thereby creating problems in that the number of elements must be increased.

SUMMARY OF THE INVENTION

In the light of the above circumstances, the present invention has been designed. A main object thereof is to provide a signal transmission circuit of a precharge system which further, reduces the nubmer of MOS transistors of the switching element.

Another object of the present invention is to provide a signal transmission circuit realizable of the aforesaid object not only when the signal transmission line is of single channel but also when it is of plural channels.

The signal transmission circuit of the present invention is adapted to control discharge switching elements of two precharged signal transmission lines. This is accomplished by switching elements (three P-channel MOS transistors and one N-channel MOS transistor) when the signal of a single channel is transmitted to the two-divided signal transmission line. When one of the signal transmission lines is at a low level, the discharge switching elements at both the signal transmission lines conduct to discharge the signal tranmsission line and the low level signal is transmitted to the other signal transmission line.

The above and further objects and features of the invention will more fully be apparent from the following detailed description with accompanying drawings.

DESCRIPTION OF THE PREFERRED EMBODIMENTS

Next, the present invention will be detailed in accordance with the drawings showing the embodiment of the invention.

Figure 3:
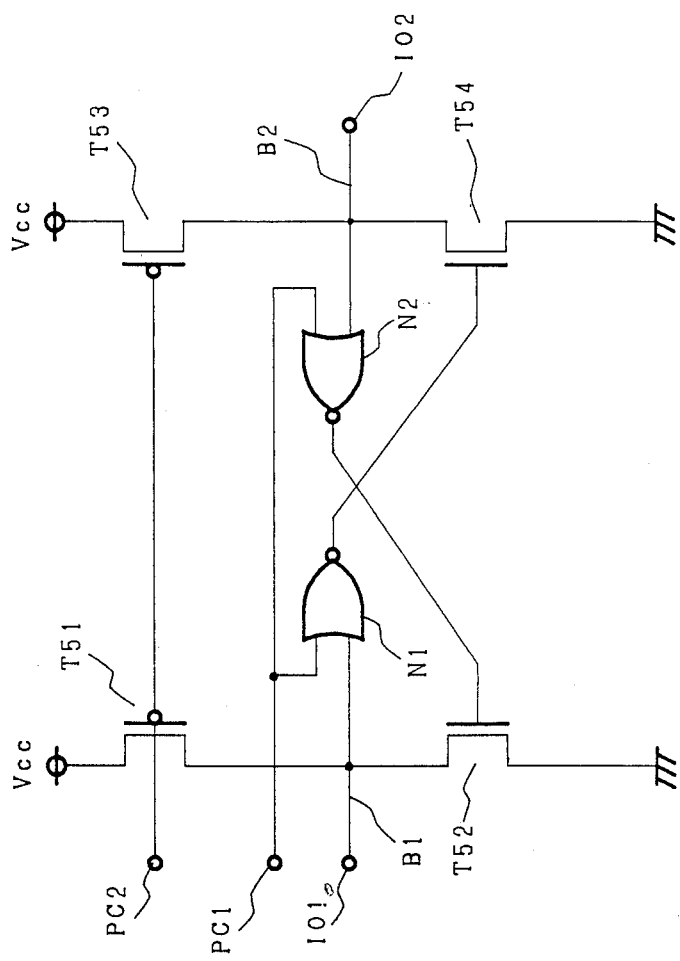
FIG. 3 is a circuit diagram of the signal transmission circuit of the precharge system which divides into two conventional signal transmission lines.
Figure 6:
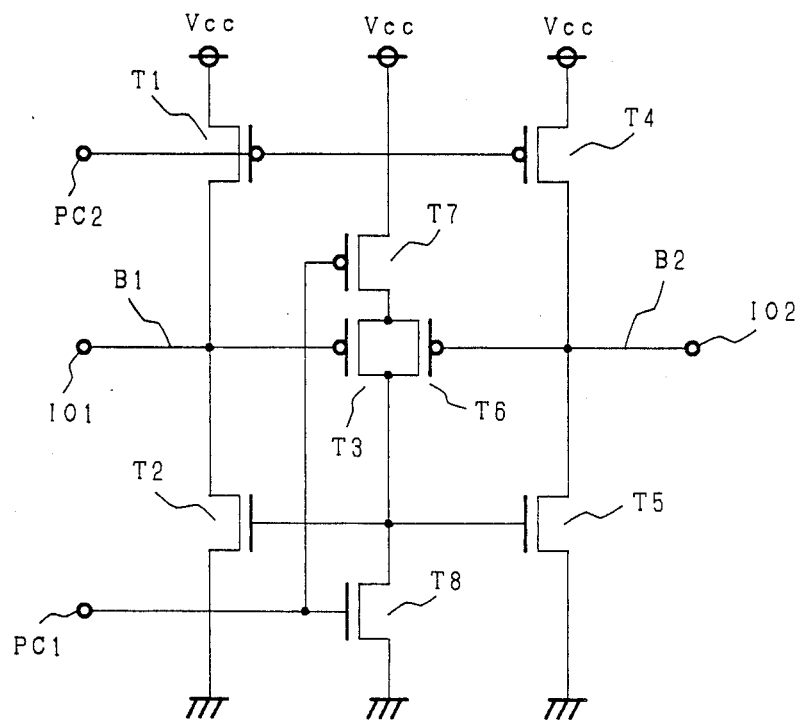
FIG. 6 is a circuit diagram of a first embodiment of a signal transmission circuit of the invention.

FIG. 6 is a circuit diagram of a first embodiment of a signal transmission circuit of the invention, showing a basic construction for transmitting a signal of one channel. In addition, in FIG. 6, the components corresponding to those in the conventional circuit in FIG. 3 are designated by the same reference numerals.

In FIG. 6, a first signal transmission line B1 connects with power supply potential $V_{cc}$ through a first P-channel MOS transistor T1 as a switching element and with earth potential through a second N-channel MOS transistor T2. The second MOS transistor T2 operates as a first discharge switching element for discharging the first signal tranmsission line B1.

The second signal transmission line B2 connects with the power supply potential $V_{cc}$ through a fourth P-channel MOS transistor T4 as the switching element and with the earth potential through a fifth N-channel MOS transistor T5. The fifth MOS transistor T5 operates as a second discharge switching element for discharging the second signal transmission line B2.

A second precharge signal terminal PC2 connects with the gate terminals at both the P-channel type first and fourth MOS transistor. Accordingly, when the second precharge signal terminal PC2 is given a low level signal, both the P-channel MOS transistors T1 and T4 conduct to give power supply potential to both the signal transmission lines B1 and B2.

Both the signal transmission lines B1 and B2 connect at one end with the first and second signal input-output terminals 101 and 102 respectively into or from which the signal is inputted or outputted. The other ends connect to the gate terminals of a third P-channel MOS transistor T3 and a sixth P-channel MOS transistor T6 respectively. The signal is transmitted between the signal input-output terminals 101 and 102 as discussed below. Both the MOS transistors T3 and T6 operate as first and second signal input switching transistors respectively.

The third and sixth MOS transistors T3 and T6 connect at one end with the power supply potential $V_{cc}$ through a seventh P-channel MOS transistor T7. At the other end transistors T3 and T6 connect to the gate terminals of the second MOS transistor T2 and fifth MOS transistor T5 respectively. Transistors T3 and T6 connect with the earth potential through an eighth N-channel transistor T8.

Meanwhile, the third and sixth MOS transistors T3 and T6 connect at the other end thereof with the gate terminals of the second and fifth N-channel MOS transistors T2 and T5 respectively. When the seventh MOS transistor T7 conducts and either the third or the sixth MOS transistor T3 or T6 conducts such that the input signal to the first precharge signal terminal PC1 is at a low level and an input signal to either the signal input-output terminal 101 or 102 is at a low level, the second and fifth MOS transistors T2 and T5 conduct so that both the signal transmission lines B1 and B2 are connected to earth potential.

Figure 4:
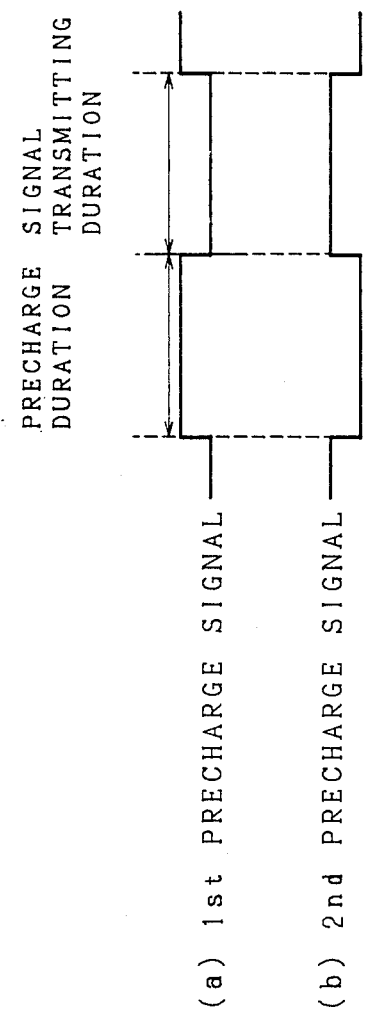
FIG. 4 is a timing chart showing the timing of the precharge signal of the circuit of FIG. 3.
Figure 5:
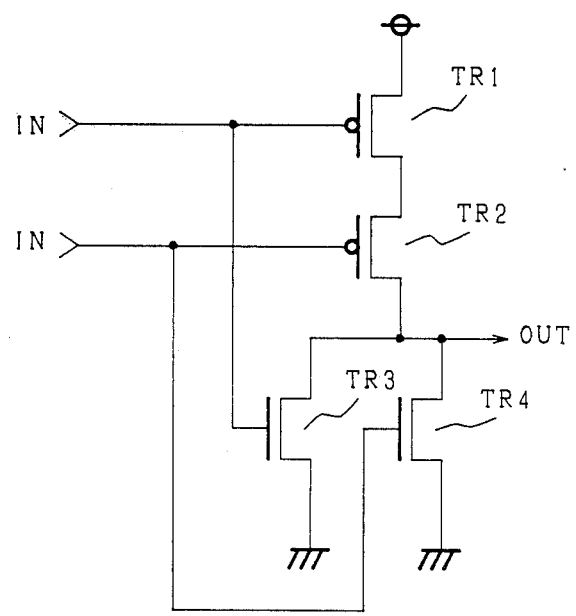
FIG. 5 is a circuit diagram of a NOR gate used in the covnentional signal transmission circuit of the prcharge system shown in FIG. 3.

Such signal tranmission circuit of precharge system operates as follows:

The first and second precharge signal terminal PC1 and PC2 are given the first and second complementary precharge signal in the same way as the conventional circuits shown in FIGS. 4(a) and (b). The period of putting the first precharge signal at a high level is the precharge period and that of putting the same at a low level is the signal transmission period.

Figure 1:
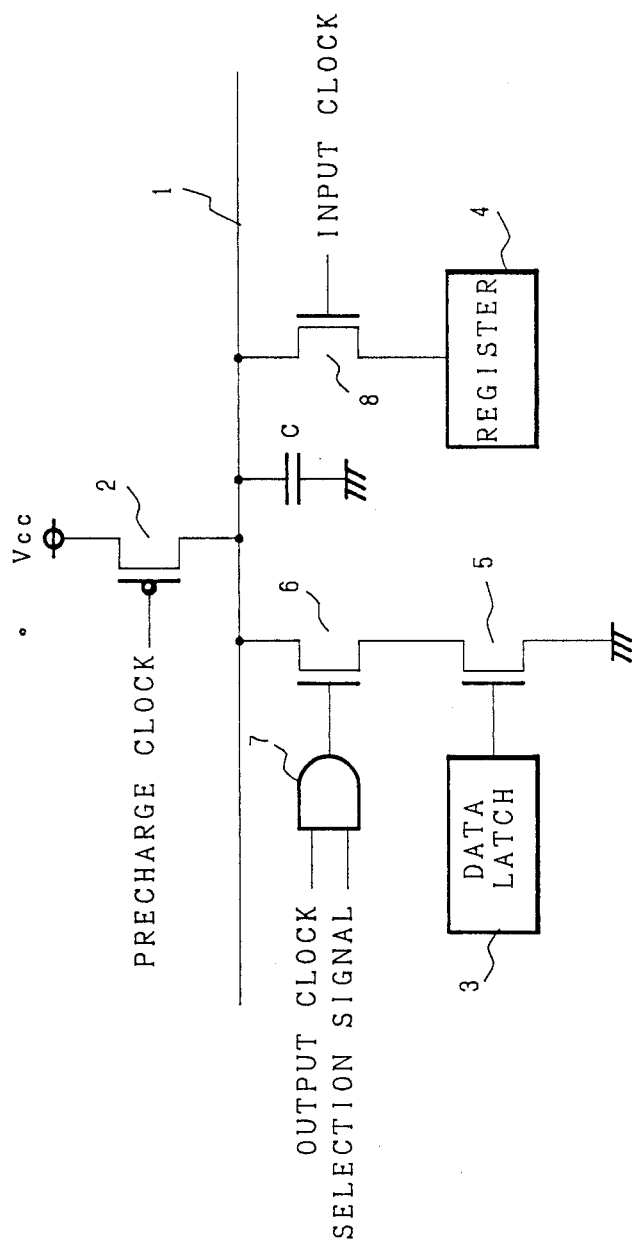
FIG. 1 is a typical circuit diagram of the conventional signal transmission circuit of a precharge system.
Figure 2:
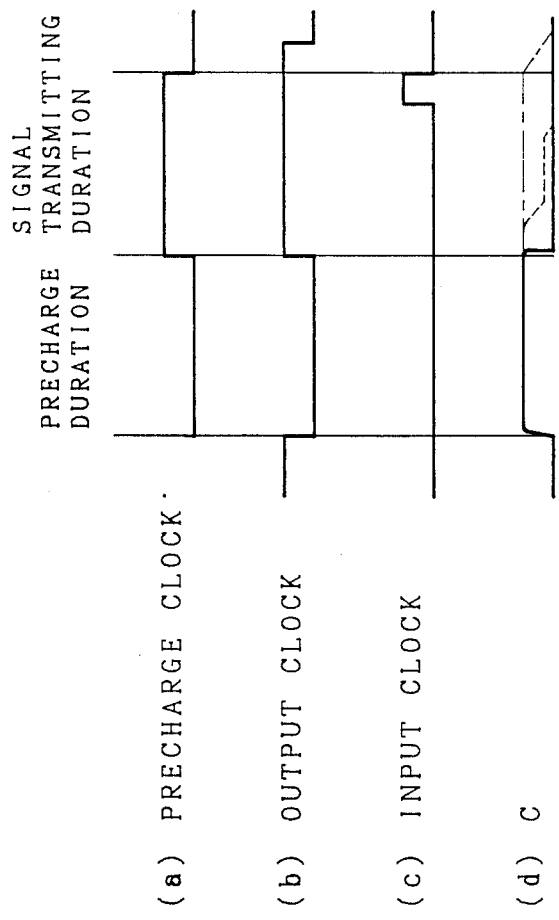
FIG. 2 is a timing chart showing the timing of each clock of the signal transmission circuit of a precharge system.

It has been described in the explanation of the operation of the conventional construction shown in FIGS. 1 and 3 that, in the signal transmission circuit of the precharge system, the signal of logical "1" or "0" is transmitted as a function of whether or not the signal transmission line (precharge line) during the precharge period is discharged during the signal transmission period. The operation of the transmission circuit of the present invention shown in FIG. 6 is basically the same as the above.

Since the low level signal is inputted to the second precharge signal terminal PC2 during the precharge period, both the first and fourth MOS transistors T1 and T4 conduct. Since the high level signal is inputted to the first precharge signal terminal PC1, the seventh MOS transistor T7 does not conduct and the eighth MOS transistor T8 conducts. Hence, the gate terminal of second and fifth MOS transistors T2 and T5 are discharged through the eighth MOS transistor T8, whereby the second and fifth MOS transistors T2 and T5 do not conduct.

Accordingly, both the signal transmission lines B1 and B2 are connected to the power supply potential $V_{cc}$ during the precharge period, but cut off from the earth potential, thereby being charged at the power supply potential (precharged).

Next, since the second precharge signal terminal PC2 is turned to high level during the singal tranmission period, the first and fourth MOS transistors T1 and T4 do not conduct. On the other hand, the input signal to the first precharge signal terminal PC1 is turned to a low level, whereby the seventh MOS transistor T7 conducts and the eighth MOS transistor T8 does not conduct. Accordingly, the second and fifth MOS transistors T2 and T5 conduct or not as a function of whether or not either the third and fifth MOS transistors T2 and T5 conduct. In other words, the transistors T2 and T5 change corresponding to a level of the input signal inputted to the first signal input-output terminals 101 or the second input terminal 102.

Now, for example, assuming that the input signal to the first signal input-output terminal 101 (the signal to be transmitted from the first signal input-output terminal 101 to the second signal input-output terminal 102) is a logical "0", the input signal to the first signal input-output terminal 101 is a low level. Hence, the third MOS transistor T3 conducts so as to give the power supply potential to the gate terminals of the second and fifth MOS transistors T2 and T5. Accordingly, since the second and fifth MOS transistors T2 and T5 conduct, the second signal transmission line B2 is grounded through the fifth MOS transistor T5 and the signal output of the second signal input-output terminal 102 is at a low level.

Conversely, assuming that the signal to be transmitted is a logical "1", the first signal input-output terminal 101 is given a high level signal. Therefore, the third MOS transistor T3 does not conduct and the fifth MOS transistor T5 is kept in a not-conductive condition, resulting in the signal output from the second signal input-output terminal 102 being held at a high level.

In other words, in the signal transmission circuit of the present invention shown in FIG. 6, the signal of logical "1" or "0" inputted from the first signal input-output terminal 101 (or the second signal input-output terminal 102) is outputted intact to the second signal input-output terminal 102 (or the first signal input-output terminal 101).

Figure 7:
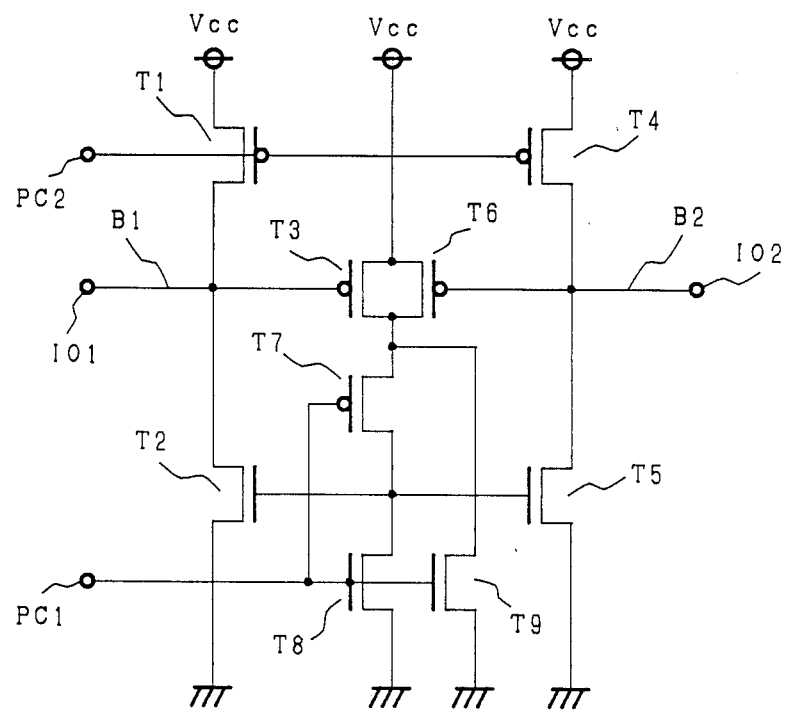
FIG. 7 is a circuit diagram of a second embodiment of the invention.

FIG. 7 is a circuit diagram of a second embodiment of the signal transmission circuit of the invention, in which a seventh MOS transistor T7 is positioned between the third and sixth MOS transistors and an eighth MOS transistor T8. Between the third and sixth MOS transistors T3 and T6 and the seventh MOs transistor T7 is newly provided a ninth N-channel MOS transistor T9 conducting as a function of the high level precharge signal given to the first precharge signal terminal PC1 during the precharge period, for discharging electricity between the third and sixth MOS transistors T3 and T6 and the seventh MOS transistor T7.

The second embodiment circuit shown in FIG. 7 is substantially the same as the first embodiment in FIG. 6.

The aforesaid first and second embodiments shown circuitry for transmitting the signal in a single channel between the first and the second transmission lines B1 and B2 of the two divided signal transmission lines which is essentially one. When a plurality of channels of signal transmission line exist, a plurality of the aforesaid construction need only be provided. For example, when the signal transmission line is of two channel construction as shown in FIG. 8, and when it is of three channel construction as shown in FIG. 9 the number of MOS transistors is reduced.

Figure 8:
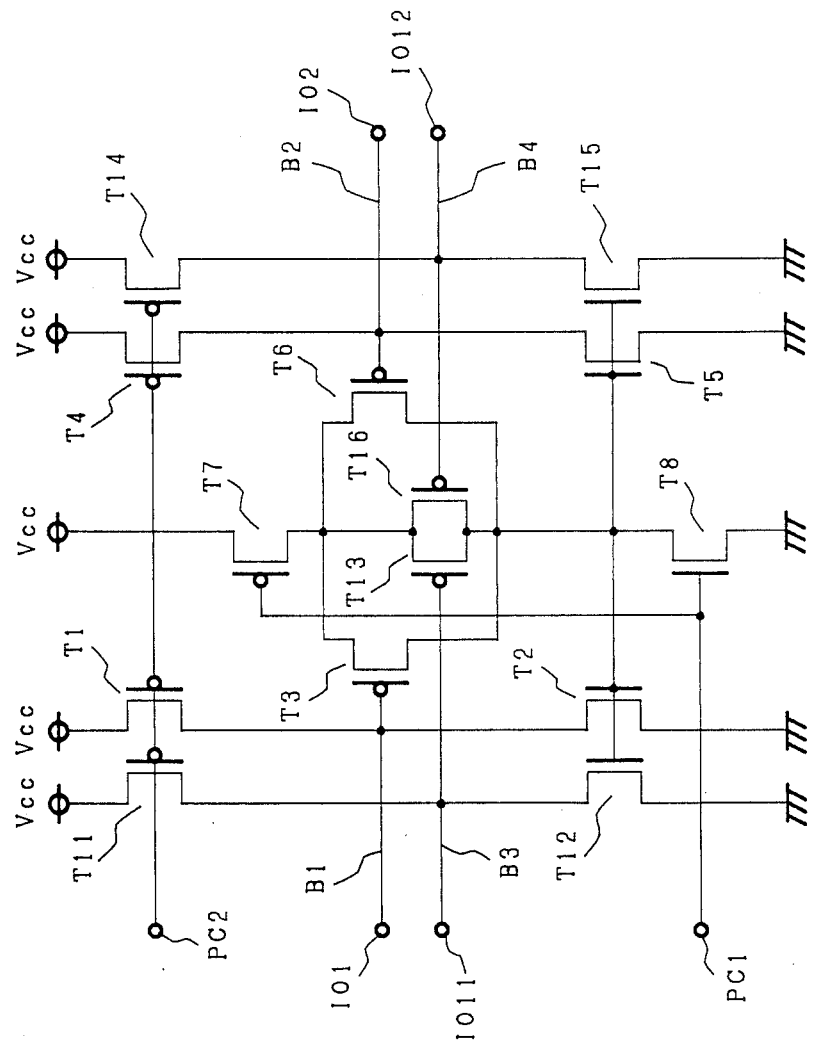
FIG. 8 is a circuit diagram of a third embodiment of a signal transmission circuit of the invention.

In the embodiment as shown in FIG. 8, the signals of two channels are transmitted from a first signal input-output terminal 101 to a second signal input-output terminal 102 and from a third signal input-output temrinal 1011 to a fourth signal input-output terminal 1012. When the signal to be transmitted is of one channel, the first to sixth MOS transistors T1 to T6 are required. When two channels are desired, two sets of T1 to T6 and T11 to T16 are required. The seventh and eighth transistors T7 and T8 are usable in common. Accordingly, such construction as above enable reduction by two MOS transistors without using two sets of the circuit shown in FIG. 6.

Figure 9:
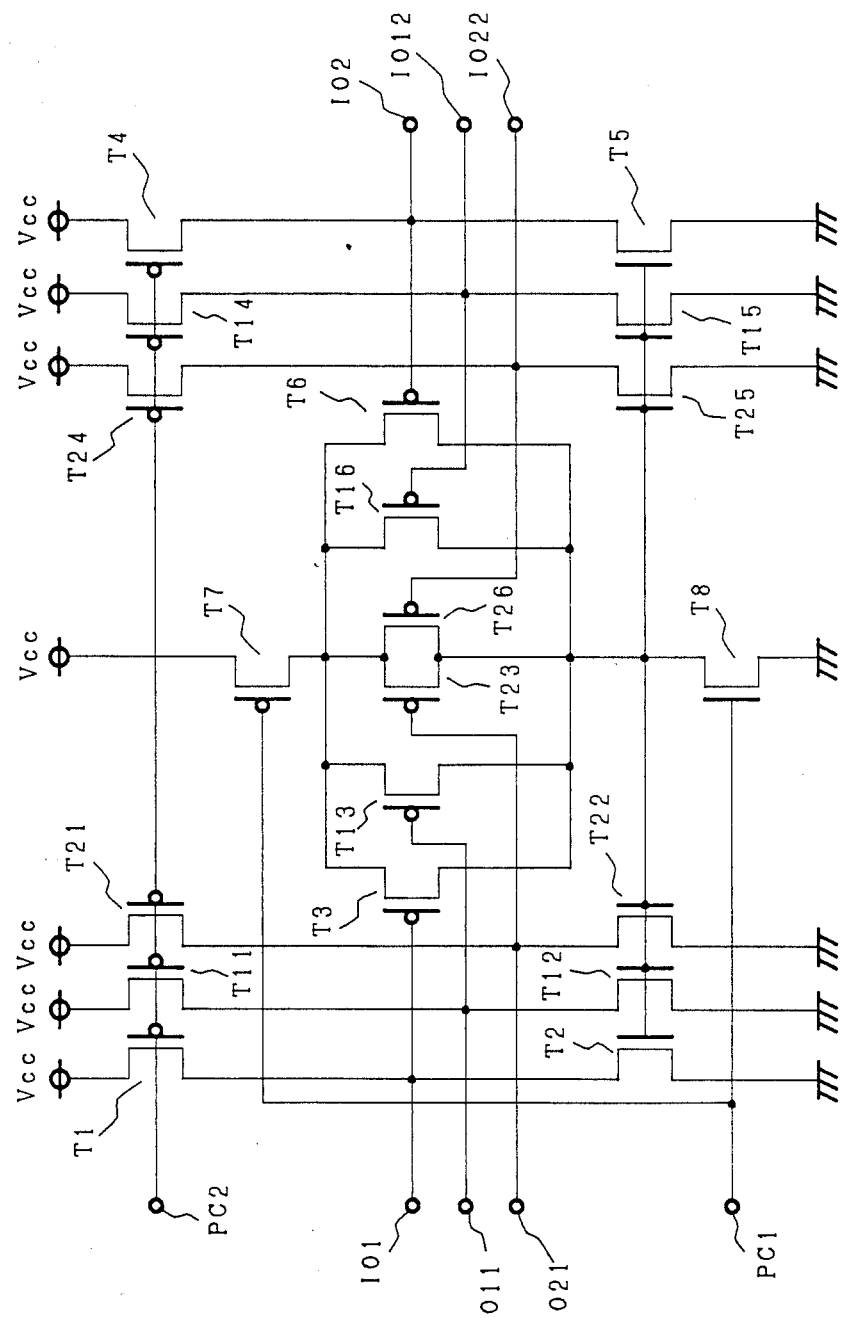
FIG. 9 is a circuit diagram of a fourth embodiment of a signal transmission circuit of the invention.

In FIG. 9, when the signals to be transmitted are of three channels between the signal input-output terminals 101 and 102, 1011 and 1012 and 1021 and 1022, three sets of first through sixth MOS transistors T1 to T6, T11 to T16 and T21 to T26 are required. The seventh and eighth MOS transistors T7 and T8 are usable in common in the same way as the construction shown in FIG. 8. This allows the number of MOS transistors to be reduced in the same way as above.

Next, even when the number of channels of the signal to be transmitted further increases, it is of course possible to use the seventh and eighth MOS transistors in common.

As seen from the above, the signal transmission circuit used, whereby the number of elements in the circuit is reduced, thereby obtaining the effect such as simplification of circuitry, reduction of failure rate, and a low manufacturing cost.

This invention may be embodied in several forms without departing from the spirit of essential characteristics thereof. The present embodiment is therefore illustrative and not restrictive. The scope of the invention is defined by the appended claims rather than by the description preceding them, and all changes that fall within the meets and bounds of the claims, or equivalence of such meets and bounds thereof are therefore intended to be embraced by the claims.

What is claimed is:

1. A signal transmission circuit, comprising:
   a first signal transmission line connected to a first potential through a first switching element, to a second potential through a second switching element, at a one end to an input-output terminal for a receiving a signal to be transmitted, and at another end to a conduction control terminal of a third switching element such that during a first period, a precharge signal is input to said first signal transmission line to charge said first signal transmission line to said first potential;
   a second signal transmission line connected to the first potential through a fourth switching element, to the second potential through a fifth switching element, at a one end to an input-output terminal for a signal to be transmitted, and at an other end to a conduction control terminal of a sixth switching element such that during said first period, a precharge signal is input to said second signal transmission line to charge said second signal transmission line to said first potential;
   a seventh switching element interposed between respective one ends of said third and sixth switching elements and said first potential, wherein, when said seventh switching element conducts, the first potential is applied to said one end of said respective third and sixth switching elements;
   an eighth switchsing element connected at one end to respective other ends of said respective third and sixth switching elements and to said conduction control terminals of said second and fifth switching elements and at the other end to the second potential, wherein when said eighth switching element conducts, said second and fifth switching elements are caused to not conduct so as to cut off said first and second signal transmission lines from the second potential;
   a first control terminal connected to the conduction control terminals of said first and fourth switching elements, wherein when given a precharge signal, said first and fourth switching elements are caused to conduct charging said first and second signal transmission lines to the first potential; and
   a second control terminal connected to said conduction terminals of said seventh and eighth switching elements and being given said precharge signal so as to control said eighth switching element for causing said second and fifth switching elements to not conduct and which is also given a transmission signal causing said seventh switching element to conduct such that the first potential is applied to said respective one end of said third and sixth switching elements; and
   a signal input to one end of said first (or said second) signal transmission line is provided to said conduction control terminal at said sixth (or the third) switching element during a second period so as to make said sixth (or said third) switching element conduct or not conduct causing said fifth (or said second) switching element to conduct or not conduct and charging said second (or said first) signal transmission line at the second potential (or the first potential) so as to transmit the signal to said second (or said first) signal transmission line.

2. A signal transmission circuit as set forth in claim 1, being provided with respective n-number of said first and second signal transmission lines, respective n-number of said first and fourth switching elements corresponding to said first and second signal transmission lines, respective n-number of said third and sixth switching elements corresponding to said first and second signal transmission lines, and respective n-number of said second and fifth switching elements, one of said respective seventh and eighth switching elements being used in common.

3. A signal transmission circuit as set forth in claim 1, wherein each of said switching elements is a MOS transistor.

4. A signal transmission circuit comprising:
a first signal transmission line connected to a first potential through a first switching element, to a second potential through a second switching element, at a one end to an input-output terminal for receiving a signal to be transmitted, and at an other end to a conduction control terminal of a third switching element such that during said first period, a precharge signal is input to said first signal transmission line to charge said first signal transmission line to said first potential;
a second signal transmission line connected to the first potential through a fourth switching element, to the second potential through a fifth switching element, at a one end to an input-output terminal for the signal to be transmitted, and at an other end to a conduction control terminal of a sixth switching element such that during said first period, a precharge signal is input to said second signal transmission line to charge said second signal transmission line to said first potential;
a seventh switching element interposed between respective one ends of said third and sixth switching elements and said second potential, wherein, when said seventh switching element conducts, the first potential is applied to said one ends of said third and sixth switching elements;
an eighth switching element connected at one end to the other end of said seventh switching element and to conduction control terminals of said second and fifth switching elements and at the other end to the second potential, wherein when said eighth switching element conducts, said second and fifth switching elements are caused to not conduct cutting off said first and second signal transmission lines from the second potential;
a first control temrinal connected to said conduction control terminals of said first and fourth switching elements, wherein when given a precharge signal, said first and fourth switching elements are caused to conduct charging said first and second signal transmission lines to the first potential;
a second control terminal connected to said conduction control terminals of said seventh and eighth switching elements and being given said precharge signal so as to control said eighth switching element for causing said second and fifth switching elements to not conduct and which is also given a transmission signal causing said seventh switching element to conduct such that the first potential is applied to said respective one end of said third and sixth switching elements; and
a signal input to one end of said first (or said second) signal transmission line is provided to said conduction control terminal at said sixth (or the third) switching element during a second period so as to make said sixth (or said third) switching element conduct or not conduct causing said fifth (or said second) switching element to conduct or not conduct and charging said second (or said first) signal transmission line at the second potential (or the first potential) so as to transmit the signal to said second (or said first) signal transmission line.

5. A signal transmission circuit as set forth in claim 4, wherein each said switching element is a MOS transistor.

6. A signal transmission circuit which charges a first and a second signal transmission line, each having an input terminal, during a first period wherein the first transmission line carries a signal which is transmitted to the second transmission line during a second period as a function of the signal on the first transmission line comprising:
a first input switching element having a first end, a second end, and a switch input connected to the first transmission line, responsive to a first predetermined signal provided on the first transmission line;
a second input switching element having a first end connected to said first end of said first input switching element, a second end connected to said second end of said first input switching element, and a switching input connected to the second transmission line responsive to a second predetermined signal provided on the second transmission line;
a first discharge switching element having a first end connected to a second potential, a second end connected to the first transmission line, and a switch input connected to said second end of each of said first and second input switching elements;
a second discharge switching element having a first end connected to said second potential, a second end connected to the second transmission line, and a switch input connected to said first end of said first and second input switching elements;
a first switching element having a first end connected to a first potential, a second end connected to said first end of said first and second input switching elements, and a switch input connected to receive an input clock signal, said first switching element for controlling said first and second discharge switching elements during the second period such that when a high signal is received on the first transmission line, the first and second discharge elements are in a first state and the second transmission line is held at said first potential and when a low signal is received on the first transmission line, said first and second discharge elements are in a second state and the second transmission line is discharged to said second potential; and
a second switching element having a first end connected to said second potential, a second end connected to said second end of each of said first and second input switching elements, and a switch input connected to receive an inverted version of said input clock signal, said second switching element for controlling said first and second discharge switching elements during the first period to allow the first and second transmission lines to charge up to said first potential.

7. A signal transmission circuit as set forth in claim 6, being provided with respective n-number of said first and second signal transmission lines, respective n-number of said first and second input switching elements corresponding to said first and second signal transmission lines, and 2n-number of said discharge switching elements corresponding to said first and second input switching elements, and using in common said one switching element for providing the first potential to one end of both said input switching elements and said one switching element connecting together said switch inputs of both said discharge switching elements to the second potential to cause discharge of the transmission lines.

8. A signal transmission circuit as set forth in claim 6, wherein said switching elements are MOS transistors.

* * * * *